United States Patent [19]

Vakerlis et al.

[11] Patent Number: 5,052,339
[45] Date of Patent: Oct. 1, 1991

[54] RADIO FREQUENCY PLASMA ENHANCED CHEMICAL VAPOR DEPOSITION PROCESS AND REACTOR

[75] Inventors: George Vakerlis, Malden; Ward D. Halverson, Cambridge, both of Mass.; Diwakar Garg, Macungie; Paul N. Dyer, Allentown, both of Pa.

[73] Assignee: Air Products and Chemicals, Inc., Allentown, Pa.

[21] Appl. No.: 598,500

[22] Filed: Oct. 16, 1990

[51] Int. Cl.$^5$ .............................................. C23C 16/50
[52] U.S. Cl. ...................................................... 118/723
[58] Field of Search ........................................ 118/723

[56] References Cited

U.S. PATENT DOCUMENTS

| | | | |
|---|---|---|---|
| 4,226,897 | 10/1980 | Coleman | 427/39 |
| 4,289,822 | 9/1981 | Shimada et al. | 428/212 |
| 4,328,258 | 5/1982 | Coleman | 427/39 |
| 4,330,182 | 5/1982 | Coleman | 352/2 |
| 4,525,417 | 6/1985 | Dimigen et al. | 428/244 |
| 4,532,150 | 7/1985 | Endo et al. | 427/39 |
| 4,534,816 | 8/1985 | Chen et al. | 156/345 |
| 4,792,378 | 12/1988 | Rose et al. | 156/643 |
| 4,810,622 | 3/1989 | Chang | 437/4 |
| 4,870,245 | 9/1989 | Price et al. | 219/121.36 |

FOREIGN PATENT DOCUMENTS 2181460 4/1987 United Kingdom .

OTHER PUBLICATIONS

Y. Suzaki et al., "Atomic Structure of Amorphous Si$_{1-x}$C$_x$ Films Prepared by R. F. Sputtering", *Thin Solid Films*, vol. 173, pp. 235–242 (1989).
K. Yamamoto et al., "Physical Properties and Structure of Carbon-Rich a-SiC:H Films Prepared by R. F. Glow Discharge Composition", *Thin Solid Films*, vol. 173, pp. 253–262 (1989).
D. A. Anderson et al., "Electrical and Optical Properties of Amorphous Silicon Carbide, Silicon Nitride and Geranium Carbide Prepared by the Glow Discharge Technique", *Philos Mag*, vol. 35, p. 1 (1977).
K. Karosawa et al., "Silicon Carbide Coating by the Plasma CVD Method", #RB 1117, pp. 1–5.
A. Raveh et al, "Characteristics of Radio Frequency Silicon Carbide Films", *J. Vac. Sci. Technol.*, vol. 2836–2841, Sep./Oct. '87.
J. W. Zon et al., "Deposition and Study of Hard Carbon Films", *J. Appl. Phys.*, vol. 65 (10), pp. 3914–3917, May '89.
A. Bubenzer et al, "RF-Plasma Deposited Amorphous Hydrogenated Hard Carbon Thin Films: Preparation, Properties, and Applications", *J. Appl. Phys.*, vol. 54(8), pp. 4590–4595, Aug. '83.
M. R. Hilton et al., "Composition, Morphology and Mechanical Properties of Plasma-Assisted Chemically Vapor-Deposited TiN Films on M2 Tool Steel", *Thin Solid Films*, vol. 139, pp. 247–260, 1986.

*Primary Examiner*—Richard Bueker
*Attorney, Agent, or Firm*—Keith D. Gourley; James C. Simmons; William F. Marsh

[57] ABSTRACT

An improved capacitively coupled radio frequency-plasma enhanced chemical vapor deposition (PECVD) apparatus and process are disclosed for depositing a uniform coating of material on substrates. The apparatus includes a secondary electrode defining a reaction zone within an outer chamber and an RF electrode in concert with the secondary electrode for generating a plasma within the reaction zone. The electrode comprising a base and a finger extending through the reaction zone for distributing a plasma field uniformly throughout the reaction zone. The process comprises heating a substrate to a deposition temperature in the range of about 300° to 650° C. Reactant gases are introduced into the PECVD reactor and a coating of about 0.2 to about 20 μm is deposited onto the heated substrate. This low temperature process is particularly adapted to coating three-dimensional objects of metals, metal alloys and mixtures of metals.

16 Claims, 2 Drawing Sheets

RADIO FREQUENCY PLASMA ENHANCED CHEMICAL VAPOR DEPOSITION PROCESS AND REACTOR

FIELD OF THE INVENTION

This invention relates to a capacitively coupled RF-plasma enhanced chemical vapor deposition (PECVD) process and reactor for depositing a uniform, hard, wear, abrasion and oxidation resistant coating on a substrate. More particularly, the invention relates to an RF-PECVD process and reactor for depositing a uniform coating on three-dimensional objects.

BACKGROUND OF INVENTION

Protective coatings have been extensively use by the mechanical, electronic, and aerospace industries to impart erosion, abrasion, corrosion, and oxidation resistance to components and increase their useful life. Several techniques such as chemical vapor deposition, physical vapor deposition, electroplating, and similar methods have been developed and used for depositing protective coatings. Electroplating and similar techniques have been extensively used to deposit metal or mixtures of metals for providing corrosion resistance. Chemical vapor deposition (CVD) processes have been used to deposit metallic and ceramic coatings on various substrates to improve wear, corrosion, and oxidation resistance performance. CVD is particularly suitable for coating 3-dimensional and complex shaped parts because the deposition technique is indirect in nature, i.e., where the reaction gases are not in the "line-of-sight" with the substrates. Most of the CVD coatings, such as titanium nitride, titanium carbide, silicon nitride and silicon carbide, require use of high deposition temperatures ($\geq 900°$ C.), thereby limiting their application to components made of temperature insensitive materials such as graphite, ceramics, and specialty alloys. Such coatings are, therefore, not suitable for many components made of ferrous and nonferrous metals and alloys because of degradation in their mechanical properties and distortion in shapes and sizes. Accordingly, there is a need to deposit protective metallic and ceramic coatings on components made of ferrous and nonferrous metals and alloys at low-temperatures without degrading their mechanical properties and distorting their shapes.

Several physical vapor deposition (PVD) techniques such as sputtering, reactive sputtering, arc evaporation have been developed and are currently being used to improve the wear and corrosion resistance of many metallic components. Although PVD techniques are being currently used commercially for many applications, their use is limited to a few coatings, e.g. titanium nitride, aluminum nitride, zirconium nitride, and similar materials, and to a few applications because of poor coating adhesion and defects in the microstructure. Therefore, there is a need to develop a low-temperature CVD process for depositing metallic and ceramic coatings on metallic components and improving their wear performance.

PECVD has been developed especially by the electronic industry to deposit various types of coatings on a variety of substrates. The process utilizes the energy of plasma to deposit protective coatings on substrates at low-temperatures. The plasma or glow discharge in PECVD is generated either by applying electric potential between two electrodes placed within the reactor under vacuum (called DC glow discharge) or by applying a radio frequency to one electrode while grounding the other under vacuum (called capacitively coupled RF glow discharge).

In the DC glow discharge process the negative and positive potentials are generally applied to the substrate and chamber wall, respectively. The substrate is generally heated by the bombardment of ions, thereby preventing independent control of temperature of the substrate.

In the RF glow discharge process an RF plasma field is generated by applying a radio frequency to one of the electrodes while grounding the other. The electrodes can be placed inside the reaction chamber. They can also be located outside the reaction chamber provided the chamber comprises a non-conductive material such as glass, quartz and the like. Because of the difficulty in generating a stable plasma by RF, most of the commercial reactors use parallel electrodes, which are placed inside the reaction chamber and are designed to coat planar substrates. The substrates to be coated are generally placed on the grounded electrode, which can be heated independent of the RF field. Furthermore, a DC bias can be applied to the substrates to control the reaction mechanism. The parallel plates in the RF plasma reactor are generally placed 2-3 cm. apart, making such a reactor unsuitable for uniformly coating 3-dimensional parts.

DC and RF plasma enhanced CVD reactors have been used to deposit a variety of coatings as taught in a number of references, examples of which are set for below. However, none of these references describe a method which is suitable for uniformly coating 3-dimensional objects.

U.S. Pat. Nos. 4,226,897 and 4,328,258 describe a DC-glow discharge method of forming undoped and heavily doped a-Si layer on a planar surface by using silane or a mixture of silane, phosphine and helium. The substrate is placed on a cathode and resistively heated to deposit the coating.

U.S. Pat. No. 4,330,182 also describes a DC-glow discharge method of forming undoped and doped a-Si layer on one side of a planar or cylindrical substrates by using either silane or a mixture of silane, phosphine and helium. The substrate is placed on a cathode heated resistively to deposit the coating.

U.S. Pat. No. 4,289,822 describes a process for depositing photoconductive amorphous $(Si_{1-x}C_x)_{1-y}(H)_y$ materials on planar surfaces by reactive sputtering and electron beam evaporation technique. It is also disclosed that the material can be deposited by conventional DC or RF glow discharge using a gaseous mixture consisting of $SiH_4$ and $CH_4$ and pressure ranging from 0.1 to 5 Torr. The substrate temperature is controlled between 100°-200° C. to obtain good quality amorphous $Si_{1-x}C_x(H)$ film.

U.S. Pat. No. 4,525,417 describes a process for co-depositing metallic element(s) and hard carbon coatings. The carbon and the metallic element, which was selected from a broad list of elements including silicon, are deposited by means of cathode sputtering in an inert gas atmosphere. The key feature of the process is that the metallic elements do not form stable carbides such as silicon carbide.

U.S. Pat. No. 4,532,150 discloses a process for depositing amorphous silicon carbide of the formula $Si_xC_{1-x}$ onto planar substrates using a conventional parallel plate PECVD reactor. In additional to teaching the conventional parallel plate plasma generating reactor, this reference teaches a continuous process for coating articles in which an RF powered electrode in rod-like form surround a drum-like rotatable grounded electrode. A film-like substrate is passed over the grounded electrode.

U.S. Pat. No. 4,534,816 describes an RF-plasma etching and deposition process using a conventional parallel plate reactor. The critical features of the reactor include electrode parallelism at low inter-electrode spacings, efficient wafer-cooling, confinement of plasma over the wafer to minimize RF and plasma leaking away from the reactor zone, uniform gas distribution and pump-out, and minimum RF and gas flow disturbances around the edge of a wafer.

U.S. Pat. No. 4,792,378 describes a process for depositing material by an RF-plasma technique in a conventional parallel plate reactor. The key feature of the process is the use of a gas dispersion disc comprising a number of apertures to improve deposition uniformity. The process and reactor are only suitable for coating planar surfaces.

U.S. Pat. No. 4,810,622 describes a conventional parallel plate PECVD process for making a heterojunction structure. It involves depositing n-type a-SiC:H, undoped a-Si:H, p-type a-SiC:H, and undoped and n-type a-SiC:H layers on a substrate by PECVD using either a mixture of $SiH_4$ and $CH_4$ with $PH_3$ or $B_2H_6$ or a mixture of $SiH_4$ and $H_2$.

U.S. Pat. No. 4,870,245 describes a plasma enhanced thermal treatment apparatus for nitridation of silicon-bearing substrates, e.g. semiconductor wafers. The plasma electrodes encircle the reactor's outer walls, which are made of non-conductive material such as quartz, for generating a plasma in the reaction zone. In one embodiment, both of the electrodes are in the form of interdigitated fingers which extend at least the full length of the reaction volume. This reactor design does not allow one to apply bias to the substrate which is important for controlling the composition and microstructure of the coating. The patented reactor is particularly suited for depositing coatings on a plurality of flat plates.

GB Patent Application No. 2,181,460 describes an apparatus and method for depositing material uniformly on a planar substrates by using a plasma enhanced chemical vapor deposition technique. The uniformity is improved by introducing gaseous mixture into the deposition chamber through a multiplicity of apertures. The process is suitable for coating planar surfaces.

Yoshihumi Suzaki et.al., "Atomic Structure of Amorphous $Si_{1-x}C_x$ Films Prepared by R. F. Sputtering," Thin Solid Films, volume 173, pages 235-242 (1898) teach an RF planar magnetron sputtering process for depositing amorphous $Si_{1-x}C_x$ (where $0 \leq X \leq 1$). The carbon atoms were shown to occupy substitutional sites of the amorphous silicone network uniformly in the range of $0 < x \leq 0.38$. Clusters of threefold carbon and of fourfold silicon and carbon existed in the film in the range of $0.38 < x \leq 1.0$. The films were deposited on the substrate maintained at room temperature. The deposition rate was claimed to increase with increasing carbon content in the film.

Kenji Yamamoto et.al., "Physical Properties and Structure of Carbon-Rich a-SiC:H Films Prepared by R. F. Glow Discharge Decomposition," Thin Solid Films, volume 173, pages 253-262 (1989) presented physical properties of carbon rich amorphous SiC:H films. The films were deposited using pure $SiH_4$, $H_2$ and $CH_4$ glow discharge at 1.5 Torr and 300° C. substrate temperature in a conventional parallel plate plasma CVD reactor. The films were described to have a composition of $Si_{0.37}C_{0.63}$.

D. A. Anderson and W. E. Spear, "Electrical and Optical Properties of Amorphous Silicone Carbide, Silicon Nitride and Germanium Carbide Prepared by the Glow Discharge Technique," Philos Mag, volume 35, page 1 (1977) presented properties of amorphous silicon carbide. The $Si_xC_{1-x}$ films (where $0 < x < 1$) were prepared using a mixture of the $SiH_4$ and $C_2H_4$ at 0.4 to 0.8 Torr and between 600° to 800° K. temperature in an inductively coupled glow discharge reactor.

Kazuyoshi Karosawa et.al., "Silicon Carbide Coating by the Plasma CVD Method", #RB 1117, pages 1-5 reported on the deposition of silicon carbide by plasma CVD method. A gaseous mixture of silane, methane and argon was deposited at 200° C. in a conventional DC plasma discharge reactor using parallel circular flat plate electrodes which resulted in a uniform coating of stoichiometric SiC on a stainless steel substrate.

A. Raveh et.al., "Characteristics of Radio Frequency Silicon Carbide Films," J. Vac. Sci. Technol. A5 (5), volume 2836-2841, Sept./Oct. 1987 presented properties of SiC films produced by a conventional RF plasma process. The crystalline hexagonal γ-SiC films were produced from a mixture of tetramethylsilane, hydrogen and argon in a low-pressure inductively coupled RF plasma reactor.

J. W. Zon, et al., "Deposition and Study of Hard Carbon Films", J. Appl. Phys., volume 65(10), pp. 3914-3917, May 1989, presented a process for depositing diamond-like carbon films on planar substrates by RF-plasma enhanced CVD using methane gas.

A. Bubenzer, et al., "RF-Plasma Deposited Amorphous Hydrogenated Hard Carbon Thin Films: Preparation, Properties, and Applications", J. Appl. Phys., volume 54(8), pp. 4590-4595, Aug. 1983, presented a process for depositing diamond-like carbon films on planar substrates by RF-plasma enhanced CVD using methane gas.

M. R. Hilton, et al., "Composition, Morphology and Mechanical Properties of Plasma-Assisted Chemically Vapor-Deposited TiN Films on M2 Tool Steel", Thin Solid Films, volume 139, pp. 247-260, 1986, presented a process for depositing hard TiN coatings on planar substrates by RF-plasma enhanced CVD using a mixture of titanium tetrachloride and ammonia.

The PECVD process and reactor designs of the prior art references are limited to coating single, flat surfaces, and are unsuitable for coating three-dimensional objects.

SUMMARY OF THE INVENTION

The disclosed PECVD process and reactor eliminates the disadvantages and shortcomings associated with the prior techniques. The improved RF-PECVD reactor is capable of uniformly depositing metallic and ceramic coatings on 3-dimensional objects. This is achieved by uniquely positioning the electrodes within a large enclosed reaction zone in order to generate a uniform plasma field in such a zone and by the manner in which the feed gaseous mixture is distributed within the reaction zone. The unique reactor design enables one to control the coating composition and uniformity by heating and applying DC bias to 3-dimensional objects independent of RF power.

Generally, the reactant gases are introduced into a reaction zone through an inlet conduit means which is connected to a gas distribution means at one end of the reaction zone. The reaction zone is defined by a grounded secondary electrode comprising an electrically conductive material. The gas distributing zone is part of the reaction zone defined by the secondary electrode. This zone can be isolated from the grounded electrode by using electrically non-conductive material. It can also be connected to the grounded electrode to become part of the grounded electrode. An RF electrode is placed completely within the reaction zone with a finger attached to a base at the end of the reaction zone opposite the gas distributing zone, i.e. the downstream end of the reactor. The finger extends through the reaction zone toward the upstream end and is parallel to the axis of the reactant gas flow and extends along the length of such an axis. When the necessary RF energy from an RF power source is supplied to the RF electrode, the RF electrode acts in concert with the secondary electrode to generate a uniform plasma field throughout the reaction zone. A heat source heats the reaction gases and substrates in the reaction zone to the necessary reaction temperatures and maintains them at these temperatures throughout the deposition process. The reaction gases thus react in the presence of the plasma to form the desired coating on the substrates which are mounted within the reaction zone.

The PECVD process of this invention for depositing uniform hard, wear and oxidation resistant coatings comprises depositing the coatings at low temperatures, i.e. in the range of about 300° to 650° C., on a various substrates, such as a single crystal, polycrystalline materials, ceramic materials and mixtures thereof. The coatings can also be deposited on a variety of ferrous and non-ferrous metals, metal alloys and mixtures of metals without degrading their mechanical properties and distorting/deforming the three-dimensional objects being coated. The composition and properties of the coatings are controlled by varying the temperature and/or feed gas composition. The coatings are extremely dense and show excellent adhesion to various substrates. Furthermore, they show excellent wear and oxidation resistance properties.

BRIEF DESCRIPTION OF THE DRAWINGS

Further features and advantages of the present invention will become apparent from the following and more particular description of the preferred embodiment of the invention as illustrated in the accompanying drawings, in which.

DETAILED DESCRIPTION OF INVENTION

In accordance with the present invention, the disclosed RF-PECVD reactor substantially reduces or eliminates the disadvantages and shortcomings associated with the prior art techniques. According to a preferred embodiment of the invention, substrates to be coated are composed of electrically conductive materials and fixtured to a substrate holder connected to a DC power supply. This permits one to impart a bias to the substrates that is independent of the plasma field generated by the RF electrode. The substrates are hung proximate the finger of the RF electrode in such a manner that they are completely enveloped within the RF field.

In another embodiment, a secondary heater is used to preheat the reactant gases as they enter the reaction zone. The secondary heater maintains the gases at a temperature close to the reaction temperature in the reaction zone.

Figure 1:
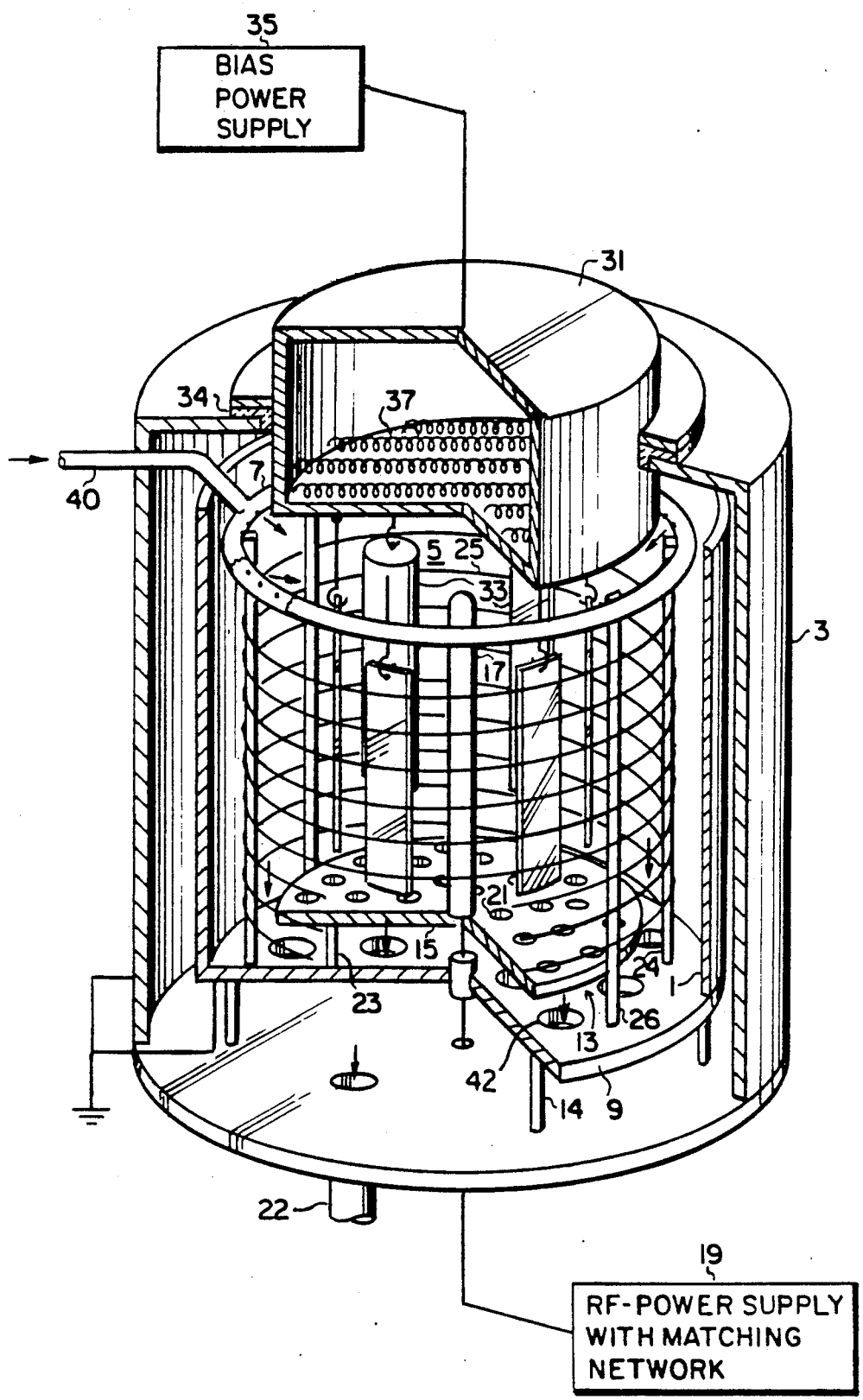
FIG. 1 is a simplified sectional view of a type of RF-PECVD reactor of the present invention.

A schematic of the RF-PECVD reactor of the present invention is shown in FIG. 1. Although FIG. 1 presents the reactor system as a down-flow reactor, it is envisioned that it may also be used effectively in an up-flow reactor (not shown). Furthermore, it is envisioned that the invention can also be used effectively in a cross-flow reactor in which the finger of the RF generator extends parallel with the axis of the horizontal gas flow.

The primary elements of the PECVD reactor of this invention consists of:

(1) A cylindrical metallic enclosure 1 placed inside vacuum chamber 3;

(2) Reaction zone 5 formed within the space of cylindrical enclosure 1, an apertured inlet gas distributor ring 7 and an apertured outlet gas plate 9; and (3) An RF electrode 13 placed completely within reaction zone 5.

Figure 2A:
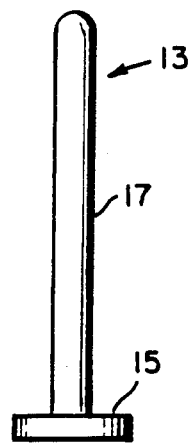
FIGS. 2A, 2B and 2C are plan views of various RF electrodes according to the present invention.
Figure 2B:
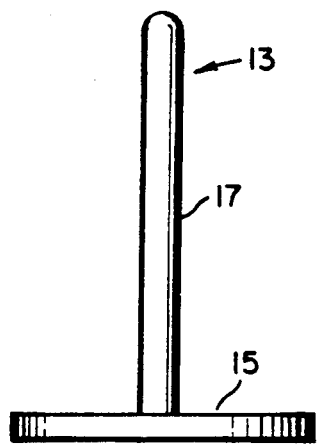
Figure 2C:
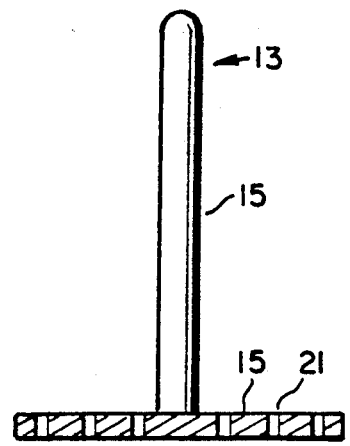

Cylindrical enclosure 1 is supported on metallic legs 14 as shown within vacuum chamber 3. The enclosure 1 is grounded and serves as the secondary electrode. RF electrode 13 consists of a flat base plate 15 and a cylindrical finger 17 and is electrically connected to RF power supply with matching network 19. FIGS. 2A, 2B and 2C illustrate the various configurations of RF electrode 13. FIGS. 2C shows the preferred embodiment in which base 15 has a plurality of apertures 21 to allow for the flow of outlet gases through outlet plate 9 and a gas outlet 22. Base plate 15 is mounted on outlet plate 9 by means of electrically insulated supports 23 as shown. Alternatively, base 15 can be sized as shown in FIG. 2A or 2B which allows for the passage of the outlet gases around its periphery. It is critical that finger 17 extends along approximately two thirds of the length of the reaction zone 5 to generate a plasma field throughout this zone. The function of RF finger 17 is to expand the plasma region as well as to improve the uniformity of plasma field.

RF electrode 13 is surrounded by a electrical resistance heater 24 made of a wire 25 wound on a suitable non-conducting ceramic support rods 26 such as those made of hexagonal boron nitride. Heater 24 is capable of maintaining the reaction temperatures between about 300° and 650° C. in the reaction zone 5 and the reaction temperature is controlled by a thermocouple (not shown) placed inside the plasma region. The thermocouple is isolated from the plasma field by using a choke (not shown). A quartz shield (not shown) is optionally placed between the RF plasma electrode 13 and the heater 24 to reduce the deposition of the coating on the wire and concomitantly to increase its life. A substrate holder 31 is mounted above the reaction zone 5 for hanging 3-dimensional objects or substrates 33 by gravity within reaction zone 5 adjacent electrode finger 17. Alternatively, substrates 33 can be mounted on rigid fixtures mounted on the upstream end of the reactor in the event a cross-flow reactor is used. Holder 31 is electrically insulated from chamber 3 by means of insulator 34 and is connected to a DC power supply 35 for applying DC bias to substrates 33 which is independent of the plasma field. An electric heater 37 is optionally placed inside holder 31 to reduce the loss of heat through the substrate holder and to pre-heat the feed gaseous mixture entering through inlet 40 and gas distribution ring 7 prior to entering reaction zone 5.

Figure 3A:
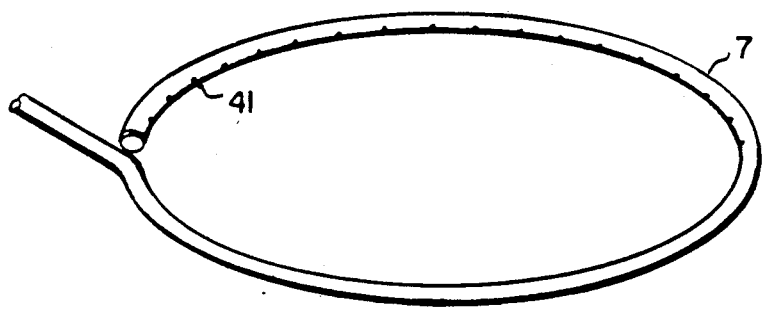
FIGS. 3A and 3B are simplified schematics of alternative embodiments of the gas distribution rings for use in the RF-PECVD reactor of the present invention.

In the examples set forth below, a reactor of the type described above in connection with FIG. 1 was used in which the diameter of metallic enclosure 1 was ~8 inches. The heating wire 25 was wound on the non-conductive ceramic support rods 26 in such a way that it provided an area of ~5 inch diameter reaction zone 5 for coating parts. The diameter of the base plate 15 was ~4.5 inches of the RF-electrode 13 shown in FIG. 2B, which was used in these examples. The distance between the base plate 15 and the bottom of the part holder 31 was ~6 inch, thereby providing an area of ~5 inches in length and ~5 inches in diameter for coating parts. The length of RF finger 17 was ~4.5 inches and it as ~0.5 inch in diameter. The feed gas was introduced through a ~5 inch diameter gas distribution ring 7 made of ~$\frac{1}{4}$ inch diameter tube as shown in FIG. 3A. The tube had a number of 1/32 inch diameter holes 41 drilled to distribute flow of feed gas uniformly. The product gas was removed from the side of the base plate 15. Although no holes were drilled in the base plate of the reactor used in the examples set forth below, a number of holes 21 as shown in FIG. 1 can be drilled having a size of $\frac{1}{8}$ inch to $\frac{1}{4}$ inch diameter to facilitate removal of product gas from the reaction zone. The diameter of holes 42 in the bottom plate 9 can be varied from $\frac{1}{8}$ inch to $\frac{1}{2}$ inch.

Figure 3B:
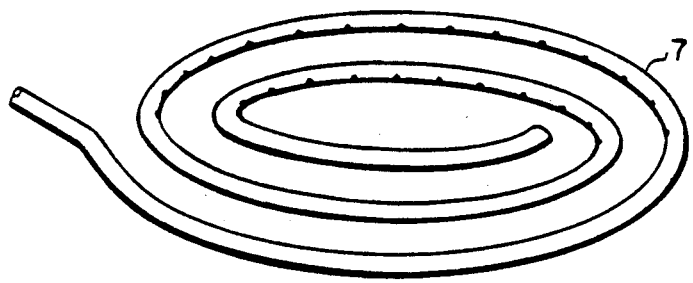

The diameter of the enclosure 1 of the reaction zone can be increased to scale-up the reactor. In this case, it will be desirable to use a spiral feed gas distribution ring shown in FIG. 3B to facilitate uniform distribution of gas in the reactor. Additionally, a number of RF fingers arranged at various radial positions can be used in the scaled-up reactor to ensure uniformity of plasma field. The length of the reactor can also be increased to scale-up the reactor and coat multiple parts. Additionally, a number of feed gas inlet rings shown in FIG. 3A can be used along the length of the reactor to replenish the supply of reactants.

The deposition conditions and the type of coating deposited in the PECVD reactor can be varied by varying any one or more of the following variables:

(1) RF-frequency and power applied to the electrode;
(2) The temperature and pressure used during the reaction;
(3) The level of bias applied to the substrate; and
(4) The type of reaction gases used.

Specifically, RF-frequency and power applied to the electrode can range up to 1,000 MHz and 2,000 watts, respectively. Preferably, they can range from 1.8 to 28 MHz and 50 to 500 watts. The substrate can be self-biased, subjected to a floating bias or applied with a negative potential of $-50$ to $-2,000$ volts. Preferably the substrate can be subjected to a negative potential of from $-50$ to $-400$ volts. The temperature in the reactor can be maintained from about 300° C. to about 650° C. The temperature in the reactor can preferably be maintained from about 300° C. to about below 500° C. for coating temperature sensitive materials. The substrate holder can be heated from 300° to 700° C. to reduce loss of heat as well as to pre-heat the feed gas mixture. The pressure in the reactor can be controlled between about 0.005 to about 10 Torr. Preferably, the pressure can be controlled between 0.05 to 5 Torr.

The PECVD reactor of the present invention is uniquely suited for depositing various metallic and ceramic coatings such as silicon, silicon carbide, silicon nitride, titanium carbide, titanium nitride, titanium carbonitride, tungsten, tungsten carbide, tungsten nitride and similar materials. It is also suitable for depositing hard carbon coating such as diamond-like carbon, which means a carbon having a hardness of greater than 1,000 Vickers characterized and deposited as described in "Critical Review Characterization of Diamond-like Carbon Films and their Application as Overcoats on Thin-Film Media for Magnetic Recording", by H. Tsai and D. B. Bogg, Journal Vacuum Science Technology, volume A5(6), Nov./Dec. 1987, pages 3287-3311. It is also suitable for depositing coating consisting of mixtures of silicon and silicon carbide, silicon, silicon carbide and diamond-like carbon, and silicon carbide and diamond-like carbon. The present reactor, as mentioned earlier, is most suitable for coating 3-dimensional objects such as rods, bearings, shafts, bearing races, brakes pads, flat discs, surgical needles and knives and other similar objects.

The reactant gases used for depositing silicon and silicon carbide includes a combination of an organosilicon compound and hydrogen. The silicon-containing compound can be selected from the group consisting of silane, silicon tetrachloride, dimethylsilane, methylsilane, tetramethyl disilane, dichlorosilane, trichlorosilane, methyl trichlorosilane, dimethyl dichlorosilane, hexamethyl disilane, hexamethyl trisilane and pentamethyl trisilane. If silane, silicon tetrachloride, dichlorosilane or trichlorosilane is used, it is necessary to supply a source of carbon to produce silicon carbide. The source of carbon can be any low molecular weight hydrocarbon such as paraffins, alkenes, and alkynes, preferably having one to six carbon atoms, and aromatics and other hydrocarbons having one to six carbon atoms which do not contain oxygen. Particularly suitable examples include methane, ethane, propane, butane, methylene, ethylene, propylene, butylene, acetylene, benzene, dimethyl ether, diethyl ether and the like. The composition of the coatings are changed by manipulating the silicon to carbon ratio in the gaseous feed mixture, preferably in the range of about to 0.25 and 2.0. For example, a carbon-rich feed gas is found to result in a coating consisting of a mixture of silicon carbide and diamond-like carbon. Likewise, a silicon-rich feed gas results in the deposition of a mixture of silicon and silicon carbide. Nitrogen and/or ammonia are added to the gaseous mixture in the event that a silicon nitride coating is desired.

To deposit titanium nitride, titanium carbide and titanium carbonitride, the primary reactants are titanium tetrachloride and hydrogen. Nitrogen and/or ammonia are used to deposit titanium nitride. One or more of the hydrocarbons listed above are used to deposit titanium carbide. In the case of titanium carbonitride, an organic compound containing both carbon and nitrogen can be used such as one of the low molecular weight nitriles, i.e. acetonitrile, acrylonitrile, and butylonitrile. A mixture of $N_2$ or $NH_3$ and a hydrocarbon can also be used to produce titanium carbonitride.

The reactant gases used for depositing W includes tungsten halide such as $WF_6$ and hydrogen and for depositing tungsten carbide include in addition to the latter a hydrocarbon or an oxygen-containing hydrocarbon such as dimethylether or diethylether. $N_2$ or $NH_3$ can be added to a mixture of $WF_6$ and $H_2$ to deposit tungsten nitride.

Finally, diamond-like carbon can be deposited using a mixture of hydrocarbon and hydrogen.

A monotomic inert gas such as argon, helium, krypton and xenon can optionally be used in combination with the reactant gaseous mixtures during the deposition in accordance with this invention.

The typical process cycle for coating the substrates using the present reactor involves the following steps:
(1) Loading the reactor with the specimens, pulling a high vacuum ($\sim 10^{-6}$ Torr) and checking the reactor for any leaks.
(2) Initiating a flow of an inert gas such as argon and heating the reactor to the desired temperature, e.g. in the range of about 300° to 650° C., using about 0.05 to 0.5 Torr vacuum and pre-heating the substrate holder to the desired temperature, i.e. 300°-700° C.
(3) After the desired temperature has been reached, striking the plasma and applying negative bias to the substrate in the presence of argon or a mixture of argon and ammonia in order to plasma clean the substrate.
(4) After plasma cleaning, establishing proper RF-frequency and power levels, applying bias to the substrate, and begin flowing the gaseous feed mixture to deposit the coating for a pre-specified time, e.g. in the range of about 5 minutes to 10 hours.
(5) Discontinuing the flow of reactive gases, turning-off RF-power and cooling the substrate under flowing argon gas.
(6) Recovering the uniformly coated specimens for inspection and further testing.

The examples which follow illustrate the use of the reactor and the process of the present invention and of the coated substrate products produced thereby. The examples are for illustrative purposes only and are not meant to limit the scope of the claims in any way.

EXAMPLES DESCRIBING PECVD REACTOR PERFORMANCE

Examples 1-4 describe the performance of PECVD reactor in depositing silicon carbide based coatings on 3-dimensional parts uniformly.

EXAMPLE 1 (Run #313)

A number of $1'' \times 3'' \times \frac{1}{8}''$ stainless steel specimens were de-greased, cleaned, and placed inside a RF-PECVD reactor as shown in FIG. 1. The reaction area within the heated wire was $\sim 5''$ in diameter and $\sim 5''$ long. The reactor was evacuated to $\sim 10^{-6}$ Torr vacuum and then heated to $\sim 500°$ C. in the presence of 40 SCCM flow of high purity argon at $\sim 0.25$ Torr pressure. At this temperature, $\sim 3$ SCCM flow of ammonia was initiated and the specimens were plasma cleaned for one hour using 1.8 MHz and 150 watts RF-power. A negative bias of $-100$ volts was applied to the specimens during the plasma cleaning. After plasma cleaning the specimens, the following conditions were established in the reactor:

| RF-power | 1.8 MHz and 250 watts |
| --- | --- |
| Substrate Bias | $-200$ volts |
| Temperature | $\sim 500°$ C. |
| Pressure | $\sim 1$ Torr |

-continued

| Flow Rate | 15 SCCM of argon |
| --- | --- |

At this time a feed gaseous mixture containing 15 SCCM of silane and 15 SCCM of methane in addition to argon was passed in the reactor for three hours to deposit silicon carbide coating. After the deposition time, the power to heater and RF-electrode was turned off and the specimens were cooled under flowing argon gas.

All the specimens were deposited with light gray, $\sim 3\mu m$ thick coating with a surface hardness of $\sim 1,215$ Kgf/mm². The coating thickness was substantially uniform throughout the specimens with a variation of less than 10% thickness from top to bottom. The coating was amorphous, as determined by x-ray diffraction analysis. It contained Si/C atomic ratio of $\sim 1.7$, as determined by x-ray photoelectron spectroscopy.

EXAMPLE 2 (RUN #315)

The procedures described in Example 1 above were repeated using the same reactor and process conditions with the exception of using 15 SCCM of silane and 10 SCCM of methane during the deposition step. The specimens were deposited with uniform, light gray, $\sim 7\mu m$ thick coating with a surface hardness of $\sim 1,600$ Kgf/mm². The coating thickness varied by less than 10% from the top to the bottom of the coupons. X-ray diffraction analysis revealed it to be amorphous. X-ray photoelectron spectroscopy revealed that the coating contained Si/C atomic ration of $\sim 2.3$.

EXAMPLE 3 (RUN #317)

The procedures described in Example 1 above were repeated using the same reactor and process conditions with the exception of using 15 SCCM of silane. The specimens were deposited with uniform, grayish blue, $\sim 2.3\ \mu m$ thick silicon coating. The coating thickness varied by less than 10% from the top to the bottom of the coupons. X-ray diffraction analysis is revealed that it was low crystalline silicon.

EXAMPLE 4 (RUN #322)

The procedures described in Example 1 above were repeated using the same reactor and process conditions with the exception of using 2 SCCM of silane and 15 SCCM of methane during the deposition step. The specimens were deposited with a thin, uniform, extremely hard ($\geqq 5,000$ Kgf/mm²) and low crystalline diamond-like carbon (DLC) coating. The coating contained only trace amounts of silicon as determined by x-ray photoelectron spectroscopy.

EXAMPLES DESCRIBING DEPOSITION OF COATINGS WITH DIFFERENT COMPOSITIONS

The examples described below present methods of depositing hard coatings containing mixtures of (1) silicon and silicon carbide, (2) silicon, silicon carbide and diamond-like carbon, and (3) silicon carbide and diamond-like carbon.

EXAMPLE 5 (RUN #502)

The procedures described in Example 1 above were repeated using the same reactor and process conditions with the following exceptions. At the reaction temperature, a flow of 17.5 SCCM of silane was introduced into the reactor in the presence of argon for 3 minutes to deposit a thin interlayer of silicon on the specimens. After 3 minutes, a mixture of 17.5 SCCM of silane and 15 SCCM of methane in addition to 15 SCCM of argon was passed into the reactor for three hours to deposit a hard coating. The silicon to carbon ratio in the feed gas was 1.17, indicating that it to be silicon rich. After the period of deposition, the power to RF-electrode was turned off and the specimens were heat treated at the deposition temperature for 30 minutes under flowing argon gas. They were then cooled to room temperature under flowing argon gas.

All the specimens were deposited with an adherent and uniform $\sim 2$ μm thick light gray coating with a surface hardness of $\sim 900$ kg/mm$^2$. X-ray photoelectron spectroscopy (XPS) of the coating indicated it to contain a mixture of silicon and silicon carbide—the Si/C atomic ratio in the coating was $\sim 2.40$. The coating was therefore extremely rich in silicon. AES analysis confirmed the coating to be extremely rich in silicon. X-ray difraction analysis showed the coating to contain a mixture of low-crystalline silicon and silicon carbide. Laser Raman spectroscopy revealed the presence of peaks around 466 and 850 cm$^{-1}$, confirming the presence of silicon and silicon carbide in the coating. The coating contained $\sim 21$ atomic percent hydrogen, as determined by Nitrogen Nuclear Reaction (NNR) analytical technique.

This example, therefore, showed that a low-crystalline coating containing a mixture of silicon and silicon carbide can be deposited by low-temperature PECVD process of this invention using Si/C ratio of 1.17 in the feed gas mixture.

EXAMPLE 6 (RUN #410)

The procedures described in Example 5 were repeated using the same reactor and reaction conditions with the exception of initially using 15 SCCM of silane in the presence of argon for three minutes for depositing a thin silicon interlayer and a mixture of 15 SSCM of silane and 15 SCCM of methane along with 15 SCCM of argon for depositing a hard coating for three hours. The silicon to carbon ratio in the feed gas was 1.0, indicating the presence of stoichiometric amounts of silicon and carbon in the feed gas for the formation of silicon carbide.

All the specimens were deposited with an adherent and uniform, $\sim 3$ μm thick light gray coating with a surface hardness of $\sim 1,500$ kg/mm$^2$. XPS analysis of the coating indicated that it contained a mixture of silicon and silicon carbide—the Si/C atomic ratio in the coating was $\sim 1.90$. The coating was, therefore, rich in silicon, but not as rich as noted in Example 5. AES analysis confirmed the coating to be rich in silicon. X-ray diffraction analysis revealed the coating to contain a mixture of low-crystalline silicon and silicon carbide. Laser Raman spectroscopy revealed the presence of peaks around 466 and 850 cm$^{-1}$, confirming the presence of silicon and silicon carbide in the coating. The film contained $\sim 21$ atomic percent hydrogen.

This example, therefore, showed that a low-crystalline coating containing a mixture of silicon and silicon carbide can be deposited by the present low-temperature PECVD process using Si/C ratio of 1.0 in the feed gas mixture. It also indicated that the amount of silicon carbide relative to silicon in the coating can be increased by reducing Si/C ratio in the feed gas.

EXAMPLE 7 (RUN #501)

The procedures described in Example 5 were repeated using the same reactor and reaction conditions with the exception of using 12.5 SCCM of silane in the presence of argon for three minutes for depositing a thin silicon interlayer and a mixture of 12.5 SCCM of silane and 15 SCCM of methane along with 15 SCCM of argon for depositing a hard coating for three hours. The silicon to carbon ratio in the feed gas was 0.83, indicating the presence of less than stoichiometric amount of silicon in the feed for the formation of silicon carbide.

All the specimens were deposited with an adherent and uniform, $\sim 2.6$ μm thick grayish-blue coating with a surface hardness of $\sim 1,200$ kg/mm$^2$. XPS analysis of the coating indicated that it contained a mixture of silicon and silicon carbide—the Si/C atomic ratio in the coating was $\sim 1.60$. The coating was, therefore, rich in silicon, but not as rich as noted in Examples 5 and 6. AES analysis confirmed the coating to be rich in silicon. X-ray diffraction analysis revealed the coating to contain a mixture of low-crystalline silicon and silicon carbide. Laser Raman spectroscopy confirmed the X-ray diffraction results. The film contained $\sim 22$ atomic percent hydrogen.

This example, therefore, showed that a low-crystalline coating containing a mixture of silicon and silicon carbide can be deposited by the present low-temperature PECVD process using Si/C ratio of 0.83 in the feed gas mixture. It also indicated that the amount of silicon carbide relative to silicon in the coating can be increased by reducing Si/C ratio in the feed gas.

EXAMPLE 8 (RUN #828)

The procedures described in Example 5 were repeated using the same reactor and reaction conditions with the exception of using 10 SCCM of silane in the presence of argon for three minutes for depositing a thin silicon interlayer and a mixture of 10 SCCM of silane and 15 SCCM of methane along with 15 SCCM of argon for depositing a hard coating for three hours. The silicon to carbon ratio in the feed gas was 0.67, indicating the presence of less than stoichiometric amount of silicon in the feed for the formation of silicon carbide.

All the specimens were deposited with an adherent and uniform, $\sim 3$ μm thick gray coating with a surface hardness of $\sim 2,300$ kg/mm$^2$. XPS analysis of the coating indicated that it contained a mixture of silicon, silicon carbide and amorphous carbon (diamond-like carbon)—the Si/C atomic ratio of the coating was $\sim 1.04$. The coating was, therefore, neither rich in silicon nor carbon. AES analysis revealed the coating to be marginally rich in silicon. X-ray diffraction analysis revealed the coating to contain low-crystalline silicon and silicon carbide. Laser Raman spectroscopy indicated the presence of silicon, silicon carbide, and diamond-like carbon (DLC) in the coating. The high hardness value of the coating was, therefore, due to the presence of silicon carbide and DLC in the coating. The film contained $\sim 23$ atomic percent hydrogen.

This example showed that a low-crystalline coating containing a mixture of silicon, silicon carbide and DLC can be deposited by low-temperature PECVD process of this invention using Si/C ratio of 0.67 in the feed gas mixture.

EXAMPLE 9 (RUN #825)

The procedures described in Example 5 were repeated using the same reactor and reaction conditions with the exception of using 5 SCCM of silane in the presence of argon for depositing a thin silicon interlayer for three minutes and a mixture of 5 SCCM of silane and 15 SCCM of methane along with 15 SCCM of argon for depositing a hard coating for three hours. The silicon to carbon ratio in the feed gas was 0.33, indicating the presence of considerably less than stoichiometric amount of silicon in the feed for the formation of silicon carbide.

All the specimens were deposited with an adherent and uniform, $\sim 3$ μm thick dark gray coating with a surface hardness of $\sim 6,000$ kg/mm$^2$. XPS analysis of the coating revealed it to contain a mixture of silicon carbide and carbon—the Si/C atomic ratio in the coating was $\sim 0.5$. The coating was, therefore, rich in carbon. AES analysis also revealed the coating to be rich in carbon. X-ray diffraction analysis showed the coating contained low-crystalline silicon carbide. Laser Raman spectroscopy indicated that the coating contained a mixture of silicon carbide and DLC (diamond-like carbon). The high hardness value of the coatings, was therefore, due to the presence of diamond-like carbon in the coating. The film contained $\sim 26$ atomic percent hydrogen.

This example showed that a low-crystalline coating containing a mixture of silicon carbide and DLC can be deposited by low-temperature PECVD using Si/C ratio of 0.33 in the feed gas.

EXAMPLE 10 (Run #317)

The procedures described in Example 5 were repeated using 15 SCCM of silane and 15 SCCM of argon during the deposition step. All the specimens were deposited with an adherent and uniform $\sim 5$ μm thick silvery coating. The coating consisted primarily of low-crystalline silicon, as determined by X-ray diffraction analysis. Laser Raman spectroscopy and XPS analysis confirmed the presence of only silicon in the coating. The surface hardness of the coating was $\sim 300$ kg/mm$^2$.

This example showed that a low-crystalline silicon coating can be deposited by this low-temperature PECVD process using a mixture of silane and argon.

DISCUSSION

Examples 5-10 showed that hard and low-crystalline coatings can be deposited uniformly and adherently on stainless steel by a low-temperature PECVD reaction system as described herein. They also show that the hardness and composition of the coatings can be varied by manipulating the composition of the gaseous feed mixture. Hard coatings containing a mixture of silicon and silicon carbide can be deposited by using either more than, equal to or slightly less than stoichiometric amount of silicon needed to form silicon carbide in the feed gas. The proportions of silicon and silicon carbide in the coatings can be varied by varying the relative amounts of silicon and carbon in the gaseous feed mixture.

The above examples also showed that harder coatings containing a mixture of silicon, silicon carbide and DLC can be deposited by using less than stoichiometric amount of silicon in the gaseous feed mixture. Once again, the proportions of silicon, silicon carbide and DLC in the coating can be altered by varying the relative amounts of silicon and carbon in the feed gas.

Finally, these examples show that considerably harder coatings containing a mixture of silicon carbide and DLC can be deposited by using carbon rich gaseous feed mixture using the reactor as shown in FIG. 1. The hardness and proportions of silicon carbide and DLC in the coating, once again, can be varied by manipulating the composition of the gaseous feed mixture.

EXAMPLES DESCRIBING PRODUCTION OF HARD COATINGS FOR WEAR AND OXIDATION TESTING

EXAMPLE 11 (Run #613)

A number of 1" diameter by $\frac{3}{8}$" thick AM-355 stainless steel discs and 1" wide $\times 2$" long $\times \frac{1}{8}$" thick flat AM-355 stainless steel wear specimens were de-greased, cleaned, and placed inside the RF-PECVD reactor of as shown in FIG. 1 in which plasma was confined to $\sim 5$" diameter and $\sim 5$" long area. The reactor was evacuated to $\sim 10^{-6}$ Torr vacuum. It was then heated to $\sim 450°$ C. in the presence of 40 SCCM flow of high purity argon under $\sim 0.25$ torr pressure. At this temperature, an additional $\sim 3$ SCCM flow of ammonia was initiated and the specimens were plasma cleaned for one hour using 1.8 MHz and 150 watts RF-power. A negative bias of $-100$ volts was applied to the specimens during the plasma cleaning. After plasma cleaning the specimens, the following conditions were established in the reactor:

| | |
|---|---|
| RF-power | 1.8 MHz and 250 watts |
| Substrate Bias | $-200$ volts |
| Temperature | 450° C. |
| Pressure | 1 Torr |
| Flow Rate | 15 SCCM of argon |

At this time, silane gas at a rate of 15 SCCM in the presence of argon was passed into the reactor for 3 minutes to deposit a thin inter-layer of silicon on the specimens. After 3 minutes a gaseous mixture containing 15 SCCM of silane and 15 SCCM of methane in addition to 15 SCCM of argon was passed in the reactor for three hours to deposit a hard coating. The silicon to carbon ratio in the feed gas was 1.0, indicating the presence of stoichiometric amount of silicon and carbon in the feed for the formation of silicon carbide. After the deposition time the power to RF-electrode was turned off and the specimens were heat treated at the deposition temperature for 30 min. under flowing argon gas. They were then cooled to room temperature under flowing argon gas.

All the discs and flat wear specimens were deposited with an adherent and uniform $\sim 5$ μm thick light gray coating with a surface hardness of $\sim 1,780$ kg/mm$^2$. The coating contained a mixture of low-crystalline silicon and silicon carbide—the Si/C atomic ratio determined by XPS was $\sim 1.5$.

This example, therefore, showed that a low-crystalline coating containing a mixture of silicon and silicon carbide can be deposited at 450° C. by using a Si/C ratio of 1.0 in the feed gas.

EXAMPLE 12 (Run #612)

The procedures described in Example 11 were repeated using the same reactor, specimens and reaction conditions with the exception of using 10 SCCM of silane for depositing a thin silicon interlayer and a mixture of 10 SCCM of silane and 15 SCCM of methane for depositing a hard coating. The silicon to carbon ratio in the feed gas was 0.67, indicating the presence of less than stoichiometric amount of silicon in the feed for the formation of silicon carbide.

All the discs and flat wear specimens were deposited with an adherent and uniform ~1.9 μm thick light gray coating with a surface hardness of ~1,250 kg/nm$^2$. The coating contained a mixture of low-crystalline silicon and silicon carbide—the Si/C atomic ratio determined by XPS was ~1.4.

This example, therefore, showed that a low-crystalline coating which contained a mixture of silicon and silicon carbide can be deposited at 450° C. by using a Si/C ratio of 0.67 in the feed gas.

EXAMPLE 13 (RUN #608)

The procedures described in Example 11 were once again repeated using the same reactor, specimens and reaction conditions with the exception of using 5 SCCM of silane during the deposition of a thin silicon interlayer and a mixture of 5 SCCM of silane and 15 SCCM of methane for depositing a hard coating. The silicon to carbon ratio in the feed gas was 0.33, indicating the presence of considerable less than stoichiometric amount of silicon in the feed for the formation of silicon carbide.

All the discs and flat wear specimens were deposited with an adherent and uniform ~3.1 μm thick drak gray coating with a surface hardness value of >6,000 kg/mm$^2$. The coating contained a mixture of low-crystalline silicon carbide and DLC—the Si/C atomic ratio determined by XPS was ~0.60.

This example, therefore, showed that a low-crystalline coating containing a mixture of silicon carbide and DLC can be deposited at 450° C. by using a Si/C ratio of 0.33 in the feed gas.

EXAMPLE DESCRIBING WEAR PERFORMANCE OF UNCOATED AND COATED AM-355 DISCS

EXAMPLE 14

The friction and wear resistance properties of uncoated AM-355 stainless steel discs and those deposited with a mixture of either silicon and silicon carbide or silicon carbide and DLC in Examples 11-13 above were determined using a Ball-on-Disc Tribometer by the Centre Suisse d'Electronique et de Microtechnique S.A. (CSEM), Neuchatel, Switzerland. The tests were carried out in a dry (~1% relative humidity), humid (~99% relative humidity) or a lubricated (SHC Mobil Oil) environment using uncoated and hardened 52-100 chrome steel balls and uncoated or coated discs at a constant load of 5N and a relative surface velocity of 10 cm/sec. The uncoated and coated discs were polished to a smooth surface finish prior to testing. The wear was determined by measuring the scar on the ball contact surface using optical microscopy and the depth of wear tracks on the disc with a profilometer.

The test results obtained in the dry environment showed considerable reduction in friction coefficient and wear rate with the coatings compared to the uncoated disc (see Table 1). The friction coefficient and wear rate were considerably lower with the disc deposited with a mixture of silicon carbide and DLC coating compared to uncoated disc and those deposited with a mixture of silicon and silicon carbide coating. The test results showed that coatings containing a mixture of (a) silicon and silicon carbide and (b) silicon carbide and DLC can be used to improve friction and wear properties of metallic elements in the dry environment.

Under the humid environment, both friction coefficient and wear rate were higher with the disc deposited with a mixture of silicon and silicon carbide than the uncoated disc, as shown in Table 2. The friction coefficient and wear rate were, however, very favorable with a disc deposited with a mixture of silicon carbide and DLC compared to the uncoated disc. Therefore, a coating containing a mixture of silicon carbide and DLC coating can be used to improve friction and wear properties of metallic elements employed in the humid environment.

In the presence of SHC 626 Mobil oil the uncoated disc showed low friction coefficient and wear rate even after $1.6 \times 10^6$ revolutions, as shown in Table 3. Although the discs coated in Example 11, 12 and 13 showed friction coefficients comparable to the one observed with the uncoated disc, they resulted in extremely low wear rate, as shown in Table 3.

This example showed that hard coatings deposited in accordance with the present invention containing a mixture of (a) silicon and silicon carbide and (b) silicon carbide and DLC provided excellent wear resistance in dry and lubricated environments. It also showed that a mixture of silicon carbide and DLC coating was exceptionally good for the use in the humid environment.

EXAMPLE DESCRIBING ABRASIVE WEAR PERFORMANCE OF UNCOATED AND COATED AM-355 STAINLESS STEEL SPECIMENS

EXAMPLE 15

The abrasive wear resistance of uncoated AM-355 stainless steel specimen and the specimens deposited with a mixture of (a) silicon and silicon carbide and (b) silicon carbide and DLC coatings in Examples 12 and 13 were determined using a Taber tester, model #503, manufactured by Teledyne Taber of North Tonawanda, N.Y. The abrasive wear tests were carried out using a 1 kg load on CS-17 abrasive wheel for a total of 10,000 revolutions. The abrasive wear performance was determined by measuring the loss in wieght by the specimens.

The test results summarized in Table 4 showed considerable reduction in the abrasive wear of specimen deposited with a mixture of silicon and silicon carbide or silicon carbide and DLC coating compared to the uncoated specimen—the coated specimens reduced the wear rate by 3 to 13 times.

This example showed that hard coatings containing a mixture of (a) silicon and silicon carbide and (b) silicon carbide and DLC provided excellent protection against abrasive wear.

EXAMPLE DESCRIBING OXIDATION RESISTANCE OF THE COATING

EXAMPLE 16 (RUN #606)

The procedures described in Example 12 were repeated to deposit a hard coating on a number of $\frac{3}{4}'' \times 1'' \times 1/32''$ molybdenum, AM-350 stainless steel and Ti/6Al/4V specimens. All the specimens were deposited with an adherent and uniform light gray coating containing a mixture of silicon and silicon carbide.

The uncoated molybdenum specimen and the one deposited with a mixture of silicon and silicon carbide were oxidized in a muffle furnace at 650° C. under flowing air to quantify their oxidation resistance. The date summarized in Table 5 showed that a mixture of silicon and silicon carbide coating provided an excellent protection against oxidation.

EXAMPLES DESCRIBING EFFECTS OF DEPOSITION TEMPERATURE, PRESSURE, AND RF POWER ON COATING COMPOSITION

EXAMPLE 17 (RUN #405)

The procedures described in Example 6 were repeated using the same reactor, specimens and flow rates of gases with the exception of using 300° C. during the plasma cleaning and the deposition steps. The silicon to carbon ratio in the feed gas was 1.0, indicating the presence of stoichiometric amounts of silicon and carbon in the feed gas for the formation of silicon carbide.

All the specimens were deposited with an adherent and uniform, ~4.2 μm thick light gray coating with a surface hardness of ~1,410 kg/mm². The Si/C atomic ratio in the coating was ~1.5, indicating it to be rich in silicon.

This example, therefore, showed that a hard silicon based coating can be deposited at temperatures as low as 300° C.

EXAMPLE 18 (RUN #414)

The procedures described in Example 6 were repeated using the same reactor, specimens and flow rates of gases with the exception of using 0.25 Torr pressure during the plasma cleaning and the deposition steps.

All the specimens were deposited with an adherent and uniform, ~2.3 μm thick light gray coating with a surface hardness of ~920 kg/mm². The Si/C atomic ratio in the coating was ~2.5, indicating it to be rich in silicon.

This example showed that a hard silicon based coating can be deposited at pressures as low as 0.25 Torr.

EXAMPLE 19 (RUN #427)

The procedures described in Example 6 were repeated using the similar reactor, specimens and flow rates of gases with the exception of using 14 MHz radio frequency during the plasma cleaning and deposition steps.

All the specimens were deposited with an adherent and uniform, ~5.1 μm thick light gray coating with a surface hardness of ~1,395 kg/mm². The Si/C atomic ratio in the coating was ~1.6, indicating it to be rich in silicon.

This example showed that a hard silicon based coating can be deposited at higher radio frequencies.

CONCLUSIONS

The foregoing examples illustrated that a wide variety of coatings can be deposited uniformly on a variety of metallic substrates by using the RF-PECVD reactor and process of this invention.

Without departing from the spirit and scope of this invention, one of ordinary skilled can make various changes and modification to the invention to adapt it to various usages and conditions. As such, these changes and modifications are properly, equitably, and intended to be, within the full range of equivalence of the following claims.

TABLE 1
FRICTION AND WEAR TEST RESULTS IN THE DRY ENVIRONMENT

| Specimen | Friction Coefficient | Wear Rate, $10^{-15}$ $M^2/N$ Disc | Ball | Total |
|---|---|---|---|---|
| Uncoated AM-355 Stainless Steel | 1.12 | 280 | 42 | 322 |
| Coated AM-355 Stainless Steel | | | | |
| Example 11 (silicon and silicon carbide) | 0.96 | 33 | 41 | 74 |
| Example 12 (silicon and silicon carbide) | 0.95 | 75 | 21 | 96 |
| Example 13 (silicon carbide and DLC) | 0.82 | 15 | 8 | 23 |

TABLE 2
FRICTION AND WEAR TEST RESULTS IN THE HUMID ENVIRONMENT

| Specimen | Friction Coefficient | Wear Rate $10^{-15}$ $M^2/N$ Disc | Ball | Total |
|---|---|---|---|---|
| Uncoated AM-355 Stainless Steel | 0.57 | 0 | 7 | 7 |
| Coated AM-355 Stainless Steel | | | | |
| Example 11 (silicon and silicon carbide) | 0.58 | 25 | 1 | 26 |
| Example 12 (silicon and silicon carbide) | 0.77 | 20 | 6 | 26 |
| Example 13 (silicon carbide and DLC) | 0.23 | 3.5 | 0.07 | 3.6 |

TABLE 3
FRICTION AND WEAR TEST RESULTS IN THE LUBRICATED ENVIRONMENT

| Specimen | Friction Coefficient | Wear Rate $10^{-15}$ $M^2/N$ Disc | Ball | Total |
|---|---|---|---|---|
| Uncoated AM-355 Stainless Steel | 0.06 | 0.06 | 0.0002 | 0.0602 |
| Coated AM-355 Stainless Steel | | | | |
| Examples 11, 12 and 13 | 0.07 | 0.00 | 0.00001 | 0.00001 |

TABLE 4
ABRASIVE WEAR TEST RESULTS

| Specimen | Weight Loss After 10,000 Revolutions, mg | Relative Improvement* |
|---|---|---|
| Uncoated AM-355 Stainless Steel | 17 | — |
| Coated AM-355 Stainless Steel | | |
| Example 12 (silicon and silicon carbide) | 1.3 | 13 |
| Example 13 (silicon carbide and DLC) | 5.4 | 3 |

* $\frac{\text{Weight Loss by Uncoated Specimen}}{\text{Weight Loss by Coated Specimen}}$

TABLE 5
OXIDATION RESISTANCE BEHAVIOR OF THE UNCOATED AND COATED MOLYBDENUM SPECIMENS

| Specimen | Exposure Time, Hours | Weight Gain or Loss, g | Relative Improvement* |
|---|---|---|---|
| Uncoated Molybdenum | 12 | −0.24 | — |
| Coated Molybdenum Example 16 | 20 | −0.0007 | 343 |

TABLE 5-continued

OXIDATION RESISTANCE BEHAVIOR OF THE
UNCOATED AND COATED MOLYBDENUM SPECIMENS

| Specimen | Exposure Time, Hours | Weight Gain or Loss, g | Relative Improvement* |
|---|---|---|---|
| (silicon and silicon carbide) | | | |

*$\frac{\text{Weight Gain by Uncoated Specimen}}{\text{Weight Gain by Coated Specimen}}$

89RAD

What is claimed is:

1. A capacitively coupled RF plasma enhanced chemical vapor deposition apparatus for depositing a uniform coating of material on substrates, said apparatus comprising:
    an outer chamber;
    a secondary electrode defining a reaction zone within said outer chamber to accommodate said substrates to be coated;
    inlet conduit means for introducing reactant gases into said reaction zone;
    reactant gas distribution means mounted in the upstream end of said reaction zone for distributing reactant gases into said reaction zone;
    an RF electrode in concert with said secondary electrode for generating a plasma within said reaction zone, said electrode comprising a base mounted in the downstream end of said reaction zone and a finger extending through said reaction zone toward said upstream end, said finger for distributing a plasma field uniformly throughout said reaction zone;
    RF power supply electrically connected to said RF electrode for supplying RF energy thereto;
    holder means mounted in said upstream end for holding a plurality of substrates within said reaction zone;
    heating means for heating said substrates within said reaction zone; and
    outlet conduit means within said outer chamber for extracting said gases from said downstream end.

2. The apparatus of claim 1 wherein a shield means for shielding said heating means from the plasma placed between said heating means and said finger of said RF electrode.

3. The apparatus of claim 1 wherein said base of said RF electrode contains a plurality of apertures to allow for the passage of gases through said outlet conduit.

4. The apparatus of claim 1 wherein said substrates are composed of electrically conducting materials and wherein a DC power supply means is electrically connected to said holder means and said substrates for applying a bias to said substrates which is independent of the plasma field generated by said RF electrode.

5. The apparatus of claim 1 wherein said secondary electrode comprises side walls and an apertured plate mounted to said side walls below said base of said RF electrode to allow for the passage of gases through said outlet conduit.

6. The apparatus of claim 6 wherein non-conducting spacers are positioned between said apertured plate and said base of said RF electrode.

7. The apparatus of claim 1 wherein a second heating means is provided for separately heating the reaction gases prior to entry into said reaction zone.

8. The apparatus of claim 1 wherein a means for drawing a vacuum is operably connected to said outlet conduit 9. The apparatus of claim 1 wherein said heater means heats said substrates to a temperature in the range of about 300° to about 650° C.

10. A capacitively coupled RF plasma enhanced chemical vapor deposition apparatus for depositing a uniform coating of material on substrates comprising a electrically conducting material, said apparatus comprising:
    an outer chamber;
    a secondary electrode defining a reaction zone within said outer chamber to accommodate said substrates to be coated;
    inlet conduit means for introducing reactant gases into said reaction zone;
    reactant gas distribution means mounted in the upstream end of said reaction zone for distributing reactant gases into said reaction zone;
    an RF electrode in concert with said secondary electrode for generating a plasma within said reaction zone, said electrode comprising a base mounted in the downstream end of said reaction zone and a finger extending through said reaction zone toward said upstream end, said finger for distributing a plasma field uniformly throughout said reaction zone;
    RF power supply electrically connected to said RF electrode for supplying RF energy thereto;
    holder means mounted in said upstream end for holding a plurality of substrates within said reaction zone; and
    heating means for heating said substrates within said reaction zone to a temperature in the range of about 300° to about 650° C.;
    a DC power supply means electrically connected to said holder means and said substrates for applying a bias to said substrates which is independent of the plasma field generated by said RF electrode; and
    outlet conduit means within said outer chamber for extracting said gases from said downstream end.

11. The apparatus of claim 10 wherein a shield means for shielding said heating means from the plasma placed between said heating means and said finger of said RF electrode.

12. The apparatus of claim 10 wherein the base of said RF electrode contains a plurality of apertures to allow for the passage of gases through said outlet conduit.

13. The apparatus of claim 10 wherein said secondary electrode comprises side walls and an apertured plate below the base of said RF electrode to allow for the passage of gases through said outlet conduit.

14. The apparatus of claim 13 wherein non-conducting spacers are positioned between said apertured plate and the base of said RF electrode.

15. The apparatus of claim 10 wherein a second heating means is provided for separately heating the reaction gases to reaction temperatures prior to entry into said reaction zone.

16. The apparatus of claim 10 wherein a means for drawing a vacuum is operably connected to said outlet conduit.

* * * * *